US009584097B2

(12) United States Patent
Bakalski

(10) Patent No.: US 9,584,097 B2
(45) Date of Patent: Feb. 28, 2017

(54) SYSTEM AND METHOD FOR A SWITCHABLE CAPACITANCE

(71) Applicant: Infineon Technologies AG, Neubiberg (DE)

(72) Inventor: Winfried Bakalski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 163 days.

(21) Appl. No.: 14/264,937

(22) Filed: Apr. 29, 2014

(65) Prior Publication Data
US 2015/0311883 A1    Oct. 29, 2015

(51) Int. Cl.
*H03H 11/28* (2006.01)
*H03K 17/687* (2006.01)
*H03J 5/24* (2006.01)

(52) U.S. Cl.
CPC ............ *H03J 5/244* (2013.01); *H03H 11/28* (2013.01); *H03K 17/687* (2013.01); *H03J 2200/10* (2013.01)

(58) Field of Classification Search
CPC ....... H03J 7/10; H03K 17/102; H03K 17/693; H03K 17/687; H03K 17/063;
(Continued)

(56) References Cited

U.S. PATENT DOCUMENTS 6,344,780 B1 *  2/2002  Dobashi ............... H03H 11/245
                                                 333/17.3
6,803,680 B2 * 10/2004  Brindle ............... H01L 27/0203
                                                 257/E27.016
(Continued)

FOREIGN PATENT DOCUMENTS

DE    102014106633 A1    11/2014
DE    102014210199 A1    12/2014
DE    102014115295 A1     4/2015

OTHER PUBLICATIONS

Thomas, A., et al., "A High Quality Factor Bulk-CMOS Switch-Based Digitally Programmable RF Capacitor," WE1E-1, Proceedings of Asia-Pacific Microwave Conference 2014, Nov. 2014, pp. 58-60.

(Continued)

*Primary Examiner* — Dean Takaoka
*Assistant Examiner* — Alan Wong
(74) *Attorney, Agent, or Firm* — Slater Matsil, LLP

(57) ABSTRACT

In accordance with an embodiment, a switchable capacitance circuit includes a plurality of capacitance-switch cells that each have a capacitance circuit having a capacitance between a first terminal and a second terminal of the capacitance circuit, and a semiconductor switching circuit including a first terminal coupled to the first terminal of the capacitance circuit, a plurality of series connected radio-frequency (RF) switch cells having a load path and a common node. Each of the plurality of series connected RF switch cells has a switch transistor and a gate resistor having a first end coupled to a gate of the switch transistor and a second end coupled to the common node. The switchable capacitance circuit also includes a resistance circuit having a first end coupled to the common node and a second end coupled to a control node.

26 Claims, 8 Drawing Sheets

(58) Field of Classification Search
CPC .. H03K 17/6871; H01L 28/40; H03H 11/245; H03H 2210/025; H03H 7/004
USPC .......... 333/24 C, 17.1, 17.3, 24 R, 172, 174; 327/337, 554
See application file for complete search history.

(56) References Cited

U.S. PATENT DOCUMENTS

| | | | |
|---|---|---|---|
| 8,604,864 B2* | 12/2013 | Ranta | H03M 1/1061 327/427 |
| 9,024,700 B2* | 5/2015 | Ranta | H03M 1/1061 327/554 |
| 2011/0002080 A1 | 1/2011 | Ranta | |
| 2013/0187828 A1* | 7/2013 | Desclos | H03H 7/38 343/861 |
| 2013/0278317 A1 | 10/2013 | Iversen et al. | |
| 2014/0340181 A1 | 11/2014 | Bakalski | |
| 2014/0375514 A1 | 12/2014 | Bakalski | |
| 2015/0109072 A1 | 4/2015 | Bakalski | |
| 2015/0171860 A1* | 6/2015 | Blin | H03K 17/102 327/379 |
| 2015/0288359 A1 | 10/2015 | Bakalski et al. | |

OTHER PUBLICATIONS

Thomas, A., et al., "A MIM-Cap Free Digitally Tunable NMOS Capacitor," Proceedings of the 8th European Microwave Integrated Circuits Conference, Oct. 6-8, 2013, pp. 21-24.

* cited by examiner

SYSTEM AND METHOD FOR A SWITCHABLE CAPACITANCE

TECHNICAL FIELD

The present disclosure relates generally to an electronic device, and more particularly to a system and method for switchable capacitance.

BACKGROUND

Tunable passive elements, such as capacitors and inductors, are used in a variety of radio frequency (RF) circuits to implement adjustable matching networks for antennas and power amplifiers, and to provide adjusting tuning for high frequency filters. Due to the high demand and production of portable devices, such tunable passive elements may be found in products such as cellular telephones, smart phones and portable computers. Providing tuning to RF circuits in such products allows these products to provide high performance RF transmission and reception in a variety of RF conditions. Programmable tuning is also helpful in RF devices that are configured to operate over different RF bands and/or configured to operate using different standards.

Tunable capacitors may be implemented in a number of ways. For example, a voltage-controlled capacitor may be used to provide a variable capacitance. Such a variable capacitance may be implemented using a reverse-biased diode junction having a capacitance that is inversely proportional to the applied reverse bias voltage. Another way in which a tunable capacitance may be implemented is by using an array of switchable capacitors whose various elements are either connected or disconnected via controllable switches. One challenge in the design of a switchable capacitor is dealing the effects of parasitic capacitance of transistors used to implement the switches. Such parasitic capacitances associated with the switching transistors may add additional capacitance to the switchable capacitance that may decrease the accuracy of the circuit and/or increase parasitic loading.

SUMMARY OF THE INVENTION

In accordance with an embodiment, a switchable capacitance circuit includes a plurality of capacitance-switch cells that each have a capacitance circuit having a capacitance between a first terminal and a second terminal of the capacitance circuit, and a semiconductor switching circuit including a first terminal coupled to the first terminal of the capacitance circuit, a plurality of series connected radio-frequency (RF) switch cells having a load path and a common node. Each of the plurality of series connected RF switch cells has a switch transistor and a gate resistor having a first end coupled to a gate of the switch transistor and a second end coupled to the common node. The switchable capacitance circuit also includes a resistance circuit having a first end coupled to the common node and a second end coupled to a control node.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a switchable capacitance that may be used in RF circuits to provide tuning for antennas, matching networks and filters. The invention may also be applied to other systems and applications including other circuits that utilize a programmable capacitance such as digitally tunable oscillators to enable a wide output frequency range and charge-pumps to enable variable frequency operation.

In embodiments of the present invention, a switchable capacitance circuit includes a plurality of capacitors coupled in series with respective switches, which are implemented using series connected switching transistors. Each switching transistor is associated with a gate resistor coupled in series with its gate and a common node, and a further resistor is coupled between the common node and a driver circuit. This further resistor may be configured to reduce the effect of loading from a combination parasitic capacitances of the series connected switching transistors and parasitic capacitances of the gate resistors. Moreover, the common resistors may be sized in order to control the turn-on and turn-off time constants of each branch of the switchable capacitance circuit.

Figure 1A:
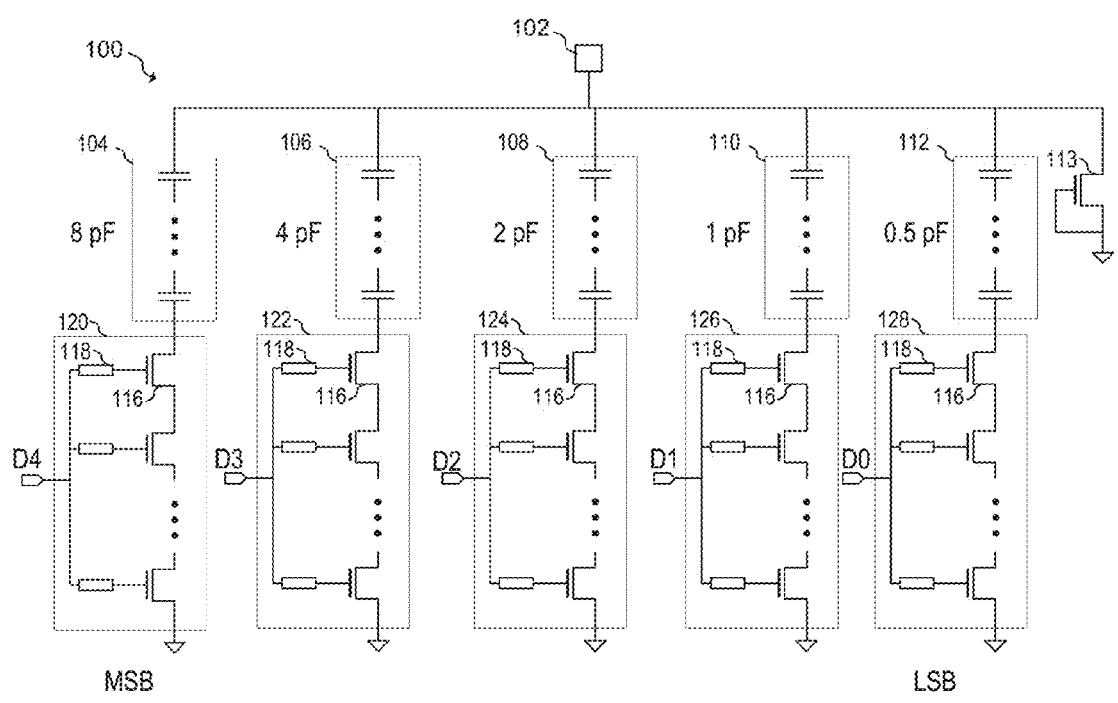
FIG. 1a-c illustrates a conventional switched capacitor circuits.

FIG. 1a illustrates a conventional digitally tunable capacitor circuit 100 that includes binary weighted capacitors 104, 106, 108, 110 and 112, each of which is coupled to series switches 120, 122, 124, 126 and 128 respectively. The values of capacitors 104, 106, 108, 110 and 112 are 8 pF, 4 pF, 2 pF, 1 pF and 0.5 pF, respectively. Each of capacitors 104, 106, 108, 110 and 112 are coupled to output pad 102, as well as to electrostatic discharge (ESD) protection transistor 113. The amount of capacitance seen at output pad 102 is controllable using digital signals D4, D3, D2, D1 and D0. For example, if signal D3 is at a logic high, thereby turning on series switch 122, and signals D4, D2, D1, and D0 or low, thereby turning off series switches 120, 124, 126 and 128, then the capacitive load seen at output pad 102 is about 4 pF.

Likewise, if all signals D3, D2, D1 and D0 are at logic high, then the load seen by the output pad 102 is about 15.5 pF.

Many systems that utilize digitally tunable capacitors may be subject to higher voltages across the digitally tunable capacitor. One example of this is the antenna interface of a cellular telephone. For example, the transmitter power amplifier of the cellular telephone can reach at the output about 35 dBm of power into nominal impedance of 50 ohms, which corresponds to a voltage of about 18 V. At the antenna interface, however, there may be impedances that far exceed 50 ohms, thereby creating transient voltages in the 50 V to 60 V range. Because devices in many semiconductor processes may only be able to withstand voltages in the 10 V range, device stacking is used to prevent device breakdown and destruction. As shown, each of capacitors 104, 106, 108, 110 and 112 are implemented using a series combination of capacitors. Likewise, series switches 120, 122, 124, 126 and 128 are implemented using series connected transistors 116, each of which has resistor 118 coupled in series with its gate. Resistors 118 keep the gate impedance high enough so as not to influence the RF impedance of the capacitor-switch combination.

One important figure of merit for a capacitor is the Q factor, which is defined as:

$$Q = \frac{\operatorname{Im}(Z)}{\operatorname{Re}(Z)},$$

where Z is the complex impedance of the capacitive element, Im(Z) is the imaginary component of the impedance, and Re(Z) is real component of the impedance. In in the case of a capacitor coupled in series with a switch, the following approximation can be made:

$$\operatorname{Im}(Z) = \operatorname{Im}\left(\frac{1}{j\omega C}\right) = \frac{1}{\omega C},$$

$$\operatorname{Re}(Z) = Ron,$$

wherein C is the value of the capacitance, Ron is the on resistance of the switch and w is the angular frequency. Therefore, the Q of the capacitor can be expressed as:

$$Q = \frac{\left(\frac{1}{\omega C}\right)}{Ron}$$

As is apparent above, the Q factor improves as C or Ron decreases. Therefore, the more series connected devices, there are, the lower the Q factor. Accordingly, as the capacitance and frequency increase, the corresponding Ron decreases in order to maintain a given Q factor. However, in some cases, as width of a transistor is increased in order to lower Ron, the corresponding lower overlap capacitances may increase. The above equation further shows that Ron and the transistor width may be scaled with the capacitance to obtain a capacitance independent Q-factor "flat-response" for all possible switched combinations.

Figure 1B:
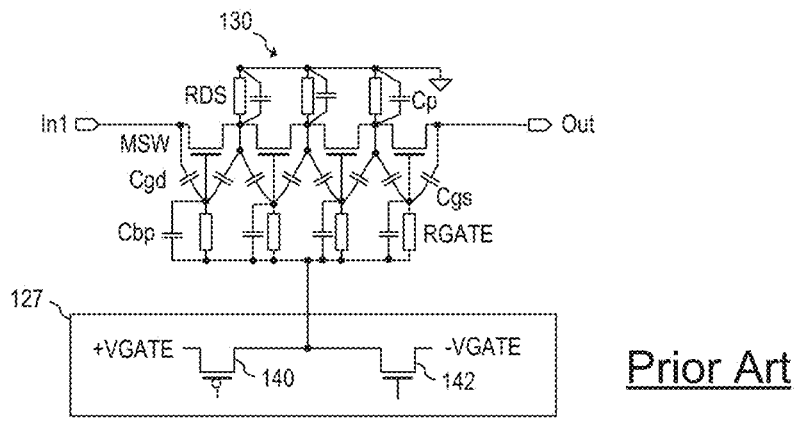

FIG. 1b illustrates a schematic of example RF switch 130 that is annotated with various parasitics and is coupled to corresponding driver 127. As shown, switch 130 includes series MSW having parasitic gate-drain capacitances Cgs and gate-source capacitances Cgs. When switch 130 is off, the series combination of parasitic capacitances Cgs and Cgd spread the RF signal present on either input node In1 or output node Out homogenously over transistors MSW. To prevent distortion of the RD signal, the resistance of RGATE and RDS may be selected to be high enough to ensure that capacitances Cgs and Cgd appear as series connected capacitances to prevent parasitic loading at input node In1 and output node Out. Example values for RGATE and RDS are 400 kΩ and 400 kΩ respectively; however, other values may be used. Under non-ideal conditions, however, the amount of isolation afforded by resistors RGATE is limited by the parasitic capacitance Cbp associated with resistors RGATE and by and the shunt capacitance of resistor RDS represented by capacitance Cp.

Parasitic capacitances Cbp and Cp may result from non-idealities of the physical implementation of resistor RGATE. For example, when resistor RGATE and/or RDS is implemented using polysilicon disposed on top of the substrate, there will be a small amount of bypass capacitance. For example, depending on the particular resistor layout, a 400 kΩ resistor may have a 2 fF bypass capacitance. At 1 GHz, a 2 fF capacitance corresponds to a capacitive impedance of 80 kΩ thereby lowering the total effective impedance of RGATE at 1 GHz. It should be appreciated that this is just one particular example of a physical resistor. Other embodiment resistors may have different resistor values and/or different parasitic capacitances associated with it.

When multiple transistors are stacked, the effect of the parasitic capacitance of resistor RGATE on device isolation is further exacerbated. For example, in one embodiment, 40 transistors are stacked in a series configuration in a 1.5 V device technology in order to handle RF voltage swings of about 60 V. Each of these 40 transistors has a series gate resistor associated with it. When the switch is turned off, the parallel combination of 40 gate resistors along with its associated parasitic capacitance further lowers the effective impedance that isolates the gate of the transistors when the transistors are turned off. With respect to the previous example, stacking 40 devices that each has an associated 400 kΩ resistor with 2 fF of parasitic capacitance creates an effective impedance of a 20 kΩ resistive impedance coupled in parallel with a 2 kΩ capacitive impedance, which provides very little gate isolation when the switch transistors are turned off.

Inverter type drivers, such as driver 127 using transistors 140 and 142 provide a very low impedance to the gates of transistors MSW of switch 130. In some implementations, this low impedance may appear as an RF ground. Moreover, when a low impedance is applied to the parasitic capacitances Cgs and Cgs, the parasitic capacitance seen at input node Iin1 and output node Out is further increased due to the effect of parasitic capacitance Cbp adding in parallel. This parasitic capacitance seen at input node Iin1 and output node Out increases as more transistors are stacked and as the widths of transistors MSW are increased. Thus, the RON*Coff figure of merit commonly used for RF switches is degraded as because of Cbp lowers the impedance of the gate resistors RGATE.

With increasing frequency, the impedance of gate resistors RGATE decreases due to parasitic capacitances Cbp, and causes capacitive coupling between interface nodes In1 and Out of switch 130 and the control output of driver 127, which may be an RF ground. In such a case, a parasitic shunt capacitance is formed by Cgs/Cgs and Cbp that adds a parasitic parallel/shunt capacitance to the adjustable capacitance circuit. This additional parasitic capacitance may necessitate a change in the topology of a RF matching circuit in some cases. Such a change may involve, for example, additional components.

Figure 1C:
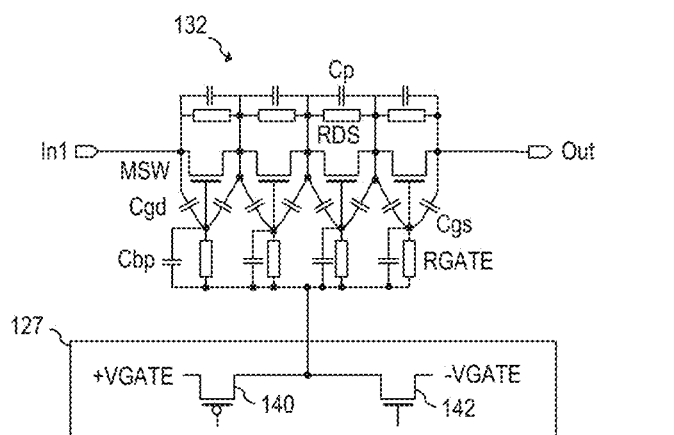

FIG. 1c illustrates switch 132 in which resistances RDS are coupled in parallel with the source/drain connections of transistors MSW instead of being coupled from a source/drain connection to ground. The value of RDS in this case may in the range of between about 20 kΩ and about 40 kΩ; however, other value outside of this range may be used depending on the particular application and its specifications. Again the shunt parasitic capacitance of each gate resistor RGATE is represented by capacitance Cbp and the shunt capacitance of resistor RDS represented by capacitance Cp. In such a circuit, the source/drain connections are biased to ground via an extra resistor (not shown) coupled to ground or by a switch input coupled to ground.

Figure 2:
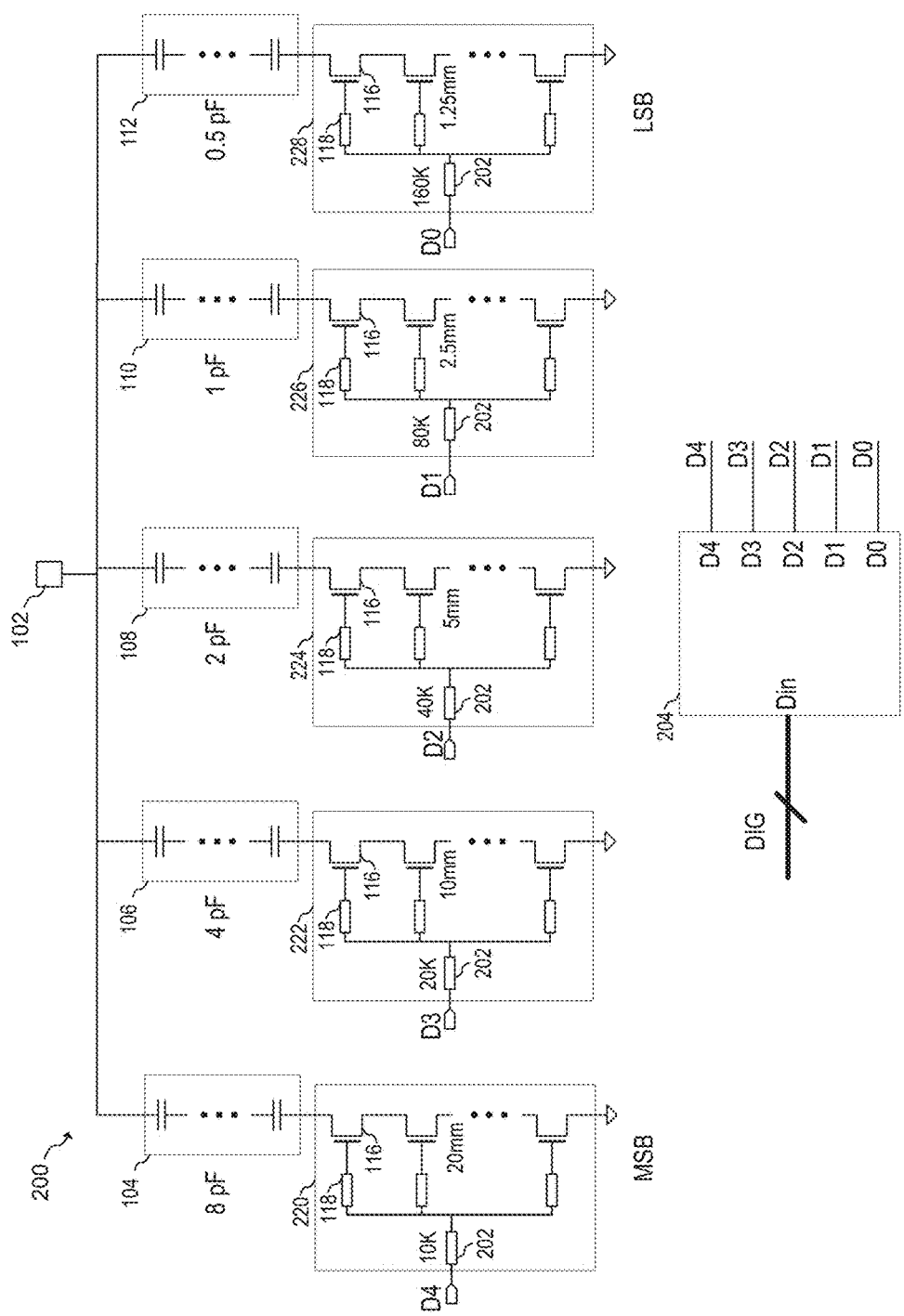
FIG. 2 illustrates an embodiment switched capacitor circuit.

FIG. 2 illustrates embodiment tunable capacitor circuit 200 that includes binary weighted capacitors 104, 106, 108, 110 and 112, each of which is coupled to series switches 220, 222, 224, 226 and 228 respectively. Based on the state of digital input bus DIG, controller 204 produces control signals D4, D3, D2, D1 and D0 that controls the amount of capacitance seen at output pad 102. Controller 204 may include a serial interface coupled to digital bus DIG that may be implemented, for example, using an SPI interface, an I2C interface, MIPI/RFFE or other serial interface known in the art. In alternative embodiments of the present invention, controller 204 may be implemented using a parallel interface. Controller 204 may determine signals D4, D3, D2, D1 and D0 using digital circuitry known in the art, such as a decoder or a lookup table. In some embodiments, the behavior of controller 204 may be programmable using non-volatile memory, fuses, mask-programmable memory, or other programming circuits and methods known in the art.

As shown, series switches 220, 222, 224, 226 and 228 each include a common resistor 202 coupled between respective control signals (D4, D3, D2, D1 and D0) and gate resistors 118. The addition of this resistance creates a higher impedance in series with the parasitic shunt capacitance associated with resistors 118, thereby decreasing the parasitic capacitive loading on tunable capacitor circuit 200. As shown, transistors 116 are implemented using NMOS devices, however, transistors 116 may be implemented using a PMOS device, or other transistor type in a CMOS-Bulk, CMOS-SOI using think or thick film silicon on insulator (SOI), GaAs-HEMTs, or other FET transistor type technology. In some cases, PIN diodes may also be used. The capacitors within capacitances 104, 106, 108, 110 and 112 may be implemented using metal-insulator-metal (MIM) capacitors and may include a plurality of capacitors coupled in series. In alternative embodiments, a single capacitor may be used, for example, in embodiments in which a single capacitor can withstand the maximum applied AC voltage swing.

In one specific embodiment, the value of resistors 118 is about 100 kΩ and the value of common resistors 202 are 10 kΩ for series switch 220 coupled to 8 pF capacitor 104, 20 kΩ for series switch 222 coupled to 4 pF capacitor 106, 40 kΩ for series switch 224 coupled to 2 pF capacitor 108, 80 kΩ for series switch 226 coupled to 1 pF capacitor 110, and 160 kΩ for series switch 228 coupled to 0.5 pF capacitor 112. By scaling the resistance of common resistors 202 to be inversely proportional to each corresponding capacitor, the RC time constant of the switching time for each branch may be kept substantially constant. As is further shown in FIG. 2, the width of the transistors used for switching transistors 116 is proportional to each corresponding capacitor. For example, a 20 mm transistor width is used in switch 220, a 10 mm width is used in series switch 222, a 5 mm width is used in series switch 224, a 2.5 mm width is used in series switch 226 and a 1.25 mm width is used in switch 228. Alternatively, other widths may be used.

It should be appreciated that the topology of tunable capacitor circuit 200 shown in FIG. 2, as well its component values, number of branches, transistor widths, and control circuit is just one example of many embodiment tunable capacitors circuits. In alternative embodiments, the tunable capacitor circuit may have different capacitance and resistor values, a different number of branches, different capacitor implementations and different topologies. For example, embodiment tunable capacitor circuits may further incorporate circuits and methods described in U.S. patent application Ser. No. 13/894,096 entitled, "System and Method for a Switchable Capacitance," filed on May 14, 2013, which application is incorporated herein by reference in its entirety.

Figure 3:
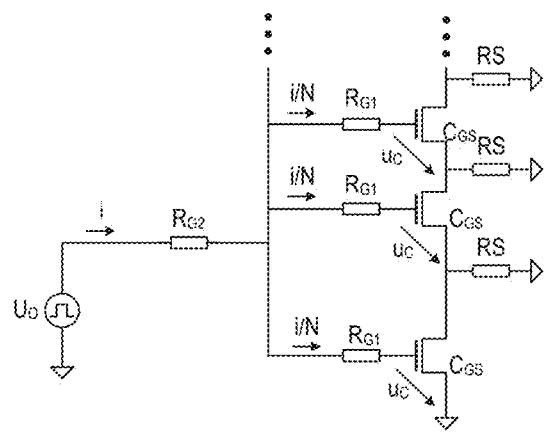
FIG. 3 illustrates a further embodiment switched capacitor circuit.

FIG. 3 illustrates a schematic of an embodiment switching circuit having N series transistors, gate resistors $R_{G1}$ coupled between the gates of the series transistors and a common node, and common resistor $R_{G2}$ coupled between the common node and a voltage source that produces voltage $U_O$. As shown, current i produced by the voltage source is divided by N among the N series transistors, and is used to charge gate-source capacitance $C_{GS}$ of each series transistor. Voltage $u_C$ is produced between the gate and source of each series transistor. An expression for the time constant τ of the gate charging time of the series transistors can be derived as follows:

$$\frac{i}{N} = C_{GS} \cdot \frac{du_C}{dt}$$

$$U_0 = i \cdot R_{G2} + \frac{i}{N} \cdot R_{G1} + u_C$$

$$U_0 = (N \cdot R_{G2} + R_{G1}) \cdot C_{GS} \cdot \frac{du_C}{dt} + u_C$$

$$\tau = (N \cdot R_{G2} + R_{G1}) \cdot C_{GS}.$$

Using the above equation for time constant τ and the relationship that the gate-source capacitance $C_{GS}$ of a transistor is proportional to the width of the transistor, a value for $R_{G2}$ may be determined for a given N, $R_{G1}$, $C_{GS}$ and time constant τ as follows:

$$R_{G2} \leq \frac{\tau - R_{G1} \cdot C_{GS}}{N \cdot C_{GS}}.$$

In some embodiments, $R_{G2}$ is made to be as large as possible to get the same time constant τ. Alternatively, this calculated value for $R_{G2}$ may be treated as a maximum value. In some embodiments, the switching time for each capacitor-switch branch is set to be the same according to the above expression.

Figure 4:
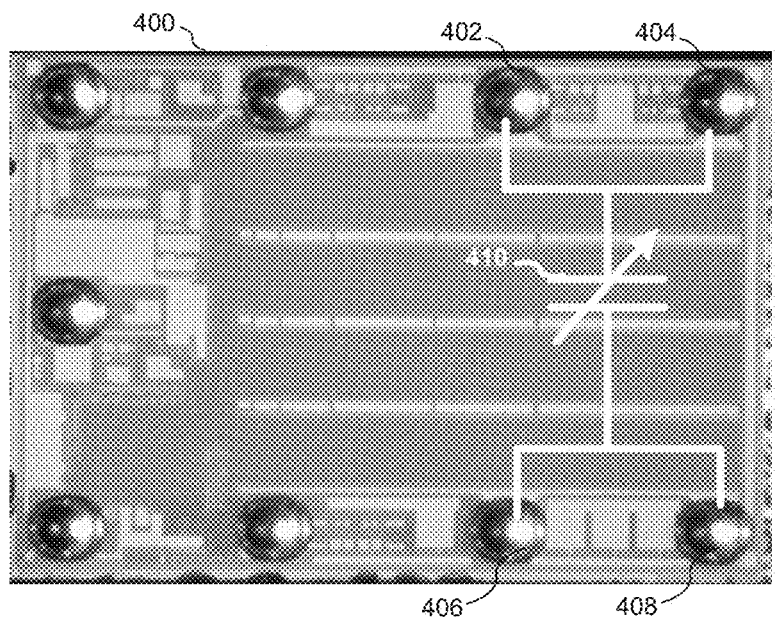
FIG. 4 illustrates a die photo of an embodiment switched capacitor circuit.

FIG. 4 illustrates a die photo of an embodiment 6-bit tunable capacitor integrated circuit (IC) 400. As shown, a tunable capacitor 410 represented by a capacitor symbol has a first electrode coupled to pins 402 and 404 and a second electrode coupled to pins 406 and 408. In an embodiment, capacitor 410 may be programmed to achieve capacitance values between about 0.5 pF and about 5 pF. It should be appreciated that in alternative embodiments of the present invention, capacitor 410 may be configured to achieve capacitance values lower than 0.5 pF and higher than 5 pF. Moreover, while the connections to IC 400 are shown as being solder balls, other types of package and die connections known in the art may be used.

Figure 5A:
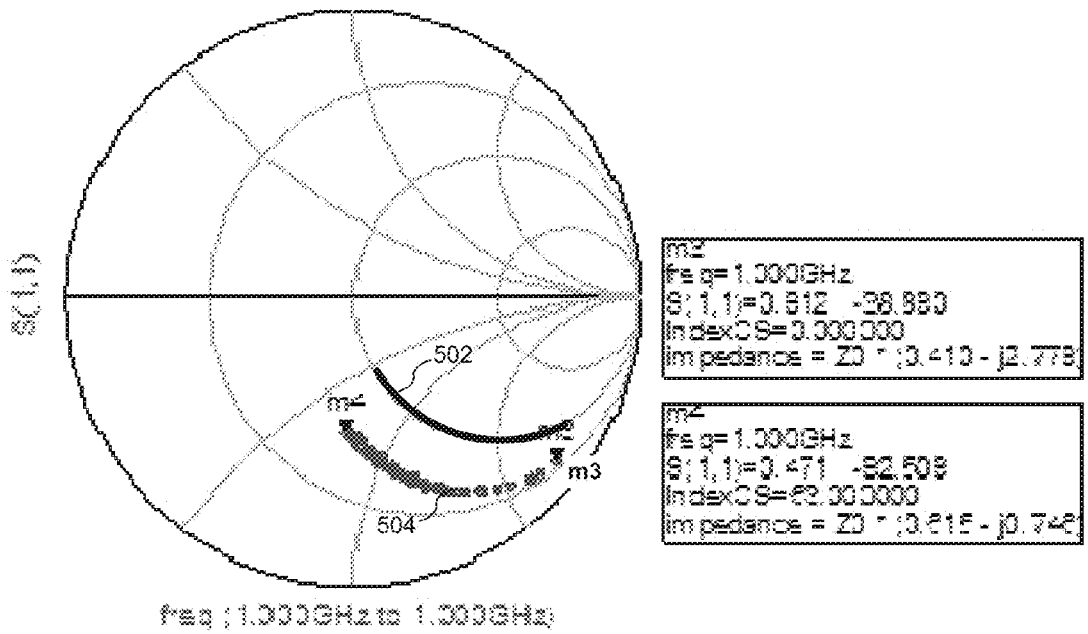
FIGS. 5a-b show Smith charts illustrating the performance of an embodiment switched capacitor circuit.
Figure 5B:
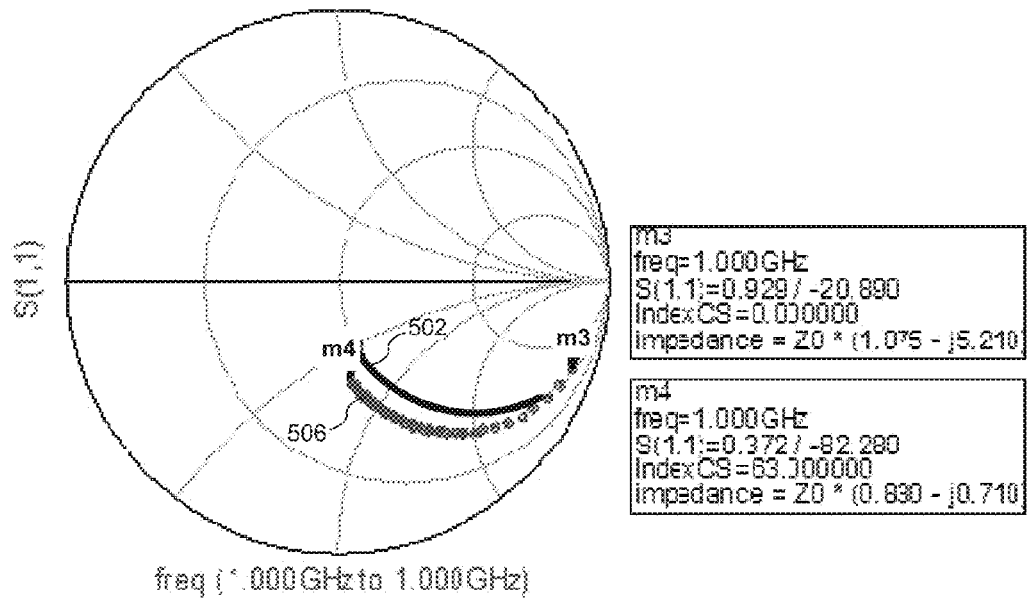

FIGS. 5a and 5b illustrate Smith charts showing the impedance of switchable capacitor circuits over various capacitor settings. FIG. 5a illustrates a Smith Chart of a circuit in which common resistor $R_{G2}$ is omitted. Line 504 represent a locus of measurements and line 502 represents an ideal switchable capacitor circuit. Label m4 represents a small capacitance setting, such as 0.5 pF, and label m3 represents a large capacitance setting, such as 5 pF. As shown, line 504 deviates from the ideal capacitance represented by line 502. In particular, the real part of the impedance is less than a normalized resistance of 1. For example, at the minimum capacitance setting, the real part of the normalized impedance is about 0.615, while at the maximum capacitance setting, the real part of the normalized impedance is about 0.410.

FIG. 5b illustrates a Smith Chart of a circuit in which common resistor $R_{G2}$ utilized according to embodiments described herein. Line 506 represent a locus of measurements and line 502 represents an ideal switchable capacitor circuit. As shown, line 506 has less deviation from the ideal capacitance represented by line 502 than line 504 in FIG. 5a. In particular, the real part of the impedance in the example of FIG. 5a is closer to a normalized resistance of 1 than the example of FIG. 5a. For example, at the minimum capacitance setting, the real part of the normalized impedance is about 0.830, while at the maximum capacitance setting, the real part of the normalized impedance is about 1.075, which is close to a normalized real impedance of 1 than line 504 of FIG. 5a. It should be appreciated that the examples of FIG. 5b reflect the performance of a specific example embodiment. Other embodiments may perform differently.

Figure 6:
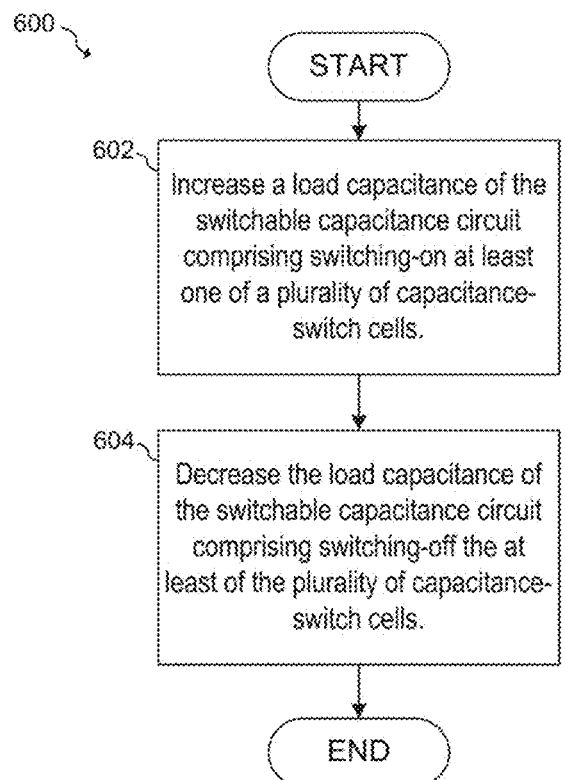
FIG. 6 illustrates a flowchart of an embodiment method.

FIG. 6 illustrates a flow chart of an embodiment method 600 of operating a switchable capacitance circuit. In step 602, a load capacitance of an embodiment switchable capacitance circuit is increased by switching-on at least one of a plurality of capacitance-switch cells. Such an embodiment switchable capacitance circuit may include a semiconductor switching circuit having a common resistor coupled to respective gate resistors of a plurality of series switching transistors. Switching-on at least one of a plurality of capacitance-switch cells may include, for example, activating the semiconductor switching circuit of at least one of the plurality of capacitance-switch cells. Next, in step 604, the load capacitance is decreased by switching-off may include, for example, deactivating the semiconductor switching circuit of at least one of the plurality of capacitance-switch cells.

Figure 7A:
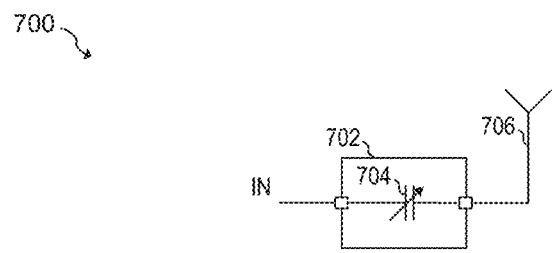
FIGS. 7a-b illustrate embodiment RF systems.
Figure 7B:
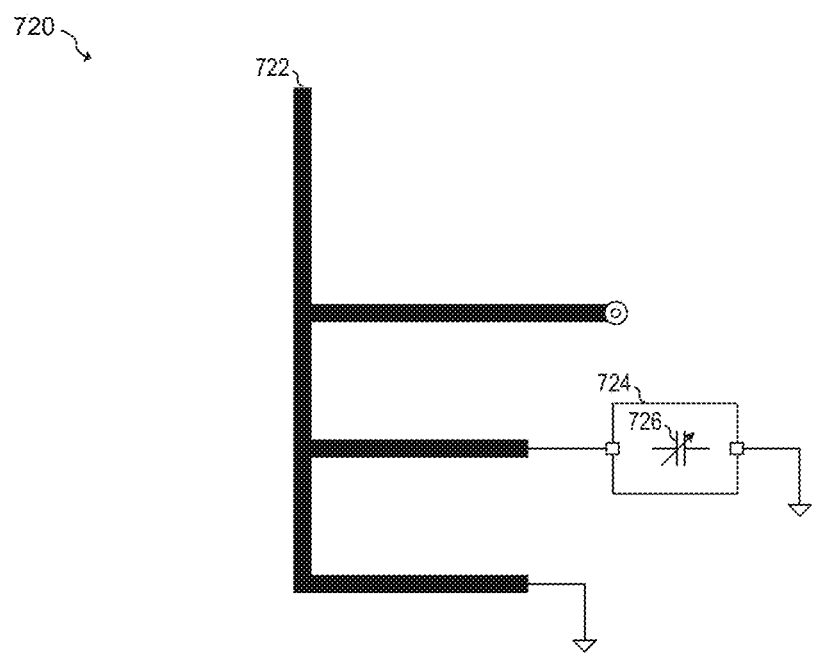

FIGS. 7a-b illustrate examples of how embodiment switchable capacitance circuits may be coupled to antennas. As shown in FIG. 7a, system 700 circuit 702 includes embodiment switchable capacitance circuit 704 is coupled to antenna 706. In an embodiment, switchable capacitance circuit 704 may be set to provide a match to antenna 706.

FIG. 7b illustrates system 720 that includes planar inverted-F (PIFA) antenna 722 coupled to circuit 724 that includes embodiment switchable capacitance circuit 726. In an embodiment, switchable capacitance circuit 726 may be set to provide a match to tune PIFA antenna 720.

Figure 8:
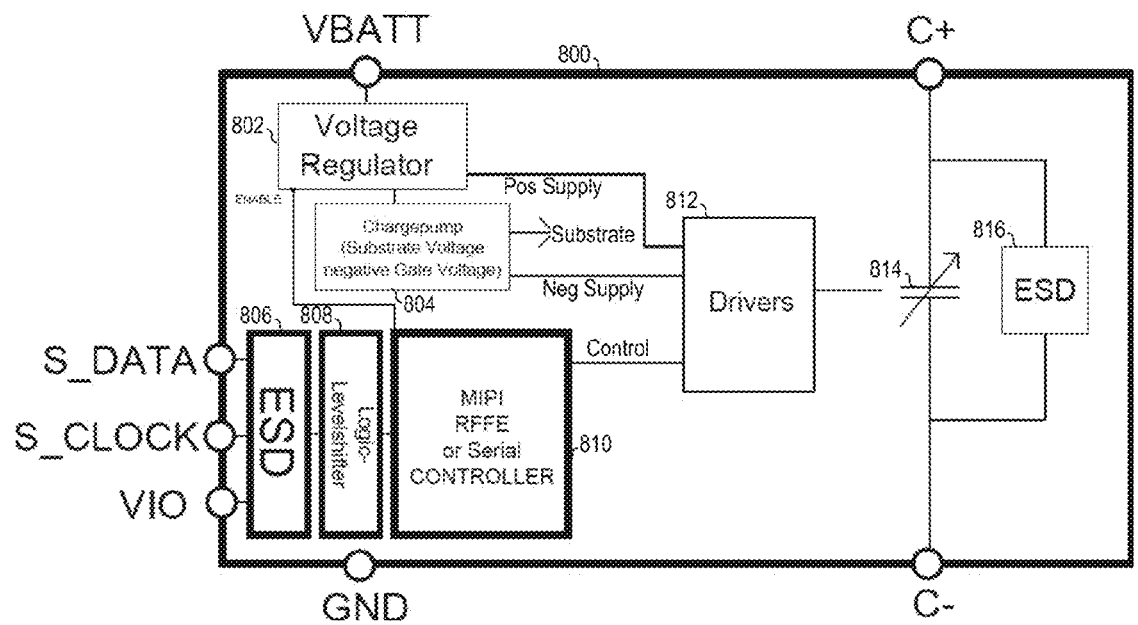
FIG. 8 illustrate an embodiment RF circuit.

FIG. 8 illustrates embodiment integrated circuit 800 that that includes embodiment switchable capacitance circuit 814 coupled between pins C+ and C−. Drivers 812 provide control signals to switches within switchable capacitance circuit 814. The state of these control signals may be set using controller 810, which may be implemented, for example, using a MIPI, RFEE or other type of serial controller. Capacitance settings may be input to controller 810 using interface pins S_DATA, S_CLOCK and VIO, and electrostatic discharge (ESD) circuit 806 provides ESD protection to circuitry coupled to these interface pins. A further ESD circuit 816 is also included to provide ESD protection to switchable capacitance 814. Voltage regulator 802 and charge pump 802 provide the requisite voltage levels to operate drivers 812. As shown, voltage regulator 802 provides a positive supply on which driver 812 bases positive control signal levels, and charge pump 804 produces a negative supply on which driver 812 bases negative control signal levels. Charge pump 804 may further produce a bias level for a substrate of integrated circuit 800. It should be appreciated that integrated circuit 800 is just one example of many possible integrated circuit implementations of embodiment switchable capacitance circuits.

In accordance with an embodiment, a switchable capacitance circuit includes a plurality of capacitance-switch cells that each have a capacitance circuit having a capacitance between a first terminal and a second terminal of the capacitance circuit, and a semiconductor switching circuit including a first terminal coupled to the first terminal of the capacitance circuit, a plurality of series connected radio-frequency (RF) switch cells having a load path and a common node. Each of the plurality of series connected RF switch cells has a switch transistor and a gate resistor having a first end coupled to a gate of the switch transistor and a second end coupled to the common node. The switchable capacitance circuit also includes a resistance circuit having a first end coupled to the common node and a second end coupled to a control node, wherein the resistance circuit comprises a resistance between the first end and the second end. The second terminal of each capacitance circuit of the plurality of capacitance-switch cells may be coupled to a same node, and a second terminal of the semiconductor switching circuit of each of the plurality of capacitance-switch cells may be coupled to ground.

In an embodiment, a value of the resistance of the resistance circuit is inversely proportional to a value of the capacitance of the capacitance circuit of the plurality of switch-capacitance cells. Also, a value of the capacitance of the capacitance circuit of a first of the plurality of capacitance-switch cells may be different from a value of the capacitance of a second of the plurality of capacitance-switch cells. In some embodiments, a value of the resistance of the resistance circuit is inversely proportional to the value of the capacitance of the capacitance circuit in the plurality of capacitance-switch cells.

In an embodiment, the resistance circuit includes a resistor coupled between the first end and the second end of the resistance circuit, and the capacitance circuit includes a capacitor coupled between the first terminal and the second terminal of the capacitance circuit. The capacitor may include a plurality of series connected capacitors. In some embodiments, the resistor has a value that is substantially equal to a value of the resistance between the first end and the second end of the resistance circuit, and the capacitor has a value that is substantially equal to a value of the capacitance between the first terminal and the second terminal of the capacitance circuit. Values of the capacitance of the capacitance circuit of the plurality of capacitance-switch cells may be binary weighted.

In an embodiment, the switchable capacitance circuit may further include a control circuit having a plurality of outputs coupled to the corresponding control nodes of the plurality of capacitance-switch cells. In some embodiments, a value of the resistance of each resistance circuit of the plurality of capacitance-switch cells is selected such that each of the plurality of capacitance-switch cells has a substantially uniform switching time.

In accordance with a further embodiment, a method of operating a switchable capacitance circuit includes increasing a load capacitance of the switchable capacitance circuit by switching-on at least one of a plurality of capacitance-switch cells. Switching-on includes activating the semiconductor switching circuit of the at least one of the plurality of capacitance-switch cells. The method further includes decreasing the load capacitance of the switchable capacitance circuit by switching-off the at least of the plurality of capacitance-switch cells, where switching-off includes deactivating the semiconductor switching circuit of the at least one of the plurality of capacitance-switch cells. Each of the plurality of capacitance-switch cells includes, for example, a capacitance circuit having a capacitance between a first terminal and a second terminal of the capacitance circuit and a semiconductor switching circuit. The semiconductor switch circuit includes a first terminal coupled to the first terminal of the capacitance circuit, a plurality of series connected radio-frequency (RF) switch cells having a load path and a common node, and a resistance circuit. Each of the plurality of series connected RF switch cells includes a switch transistor and a gate resistor having a first end coupled to a gate of the switch transistor and a second end coupled to the common node. The resistance circuit has a first end coupled to the common node and a second end coupled to a control node, wherein the resistance circuit comprises a resistance between the first end and the second end, In an embodiment, activating the first semiconductor switching circuit of the at least one of the plurality of capacitance-switch cells includes activating the plurality of series connected RF switch cells of the at least one of the plurality of capacitance-switch cells via the control node. A value of the resistance of the resistance circuit may be inversely proportional to a value of the capacitance of the capacitance circuit of the plurality of switch-capacitance cells.

In an embodiment, the method further includes applying an RF signal to the switchable capacitance circuit. The method may further include coupling the switchable capacitance circuit to an antenna, and tuning the antenna by increasing and decreasing the load capacitance of the switchable capacitance circuit. In some embodiments the method further includes receiving a command from a digital interface and decoding the command. Increasing and decreasing the load capacitance may further includes selectively activating the first semiconductor switching circuit of the plurality of capacitance-switch cells according to the decoded command.

In accordance with a further embodiments, a tunable radio-frequency (RF) circuit includes a semiconductor substrate and a plurality of capacitance-switch cells disposed on the semiconductor substrate. Each capacitance-switch cell includes a capacitor coupled between a first terminal and a second terminal, and a semiconductor switching circuit including a first terminal coupled to the first terminal of the capacitance circuit, a plurality of series connected radio-frequency (RF) switch cells, and a common resistor. The plurality of series connected radio-frequency (RF) switch cells each include a switch transistor and a gate resistor having a first end coupled to a gate of the switch transistor and a second end coupled to the common node. The common resistor has a first end coupled to the common node and a second end coupled to a control node.

In an embodiment, a capacitance of the capacitor is inversely proportional to a resistance of the common resistor. In one example, values of the capacitors of the capacitance circuit of the plurality of capacitance-switch cells are binary weighted. The switch transistor may be implemented using a MOSFET transistor. In some cases, the gate width of the MOSFET is proportional to a capacitance of the capacitor. This capacitor may include, for example, a metal-insulator-metal (MIM) capacitor.

In an embodiment, the tunable RF circuit further comprises a driver circuit coupled to the control nodes of the plurality of capacitance-switch cells, and may further includes at least one of a charge pump and a voltage regulator coupled to the driver circuit. The driver circuit, charge pump and/or voltage regulator may also be disposed on the semiconductor substrate.

Advantages of embodiments of the present invention include the ability to implement a switched capacitance circuit having a more accurate capacitance due to the reduction of parasitic loading of capacitances associated with a resistors coupled to gates of switching transistors. A further advantage includes the ability to switch a plurality of switch-capacitance branches with a same time constant. Further advantages of embodiments include better decoupling from an RFIC to a logic IC, as well as better spurious performance.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, embodiment switch drivers could be used to tune oscillators by switching in and out capacitors and other tuning components. Embodiment switch driver circuits may also be applied to receive/transmit switches, attenuators, power amplifier bypass circuits, RF matching, RF filter switching in general, as well as other types of circuits and systems.

What is claimed is:

1. A switchable capacitance circuit comprising:
a plurality of capacitance-switch cells, wherein each capacitance-switch cell comprises:
    a capacitance circuit having a capacitance between a first terminal and a second terminal of the capacitance circuit; and
    a semiconductor switching circuit comprising
        a first terminal coupled to the first terminal of the capacitance circuit,
        a plurality of series connected radio-frequency (RF) switch cells comprising a load path and a common node, wherein each of the plurality of series connected RF switch cells comprises a switch transistor and a gate resistor having a first end coupled to a gate of the switch transistor and a second end coupled to the common node, and
        a resistance circuit having a first end coupled to the common node and a second end coupled to a control node, wherein the resistance circuit comprises a resistance between the first end and the second end,
    wherein the gate resistor in each of the plurality of RF switch cells has a same resistance value,
    wherein the switch transistors in a first of the plurality of capacitance-switch cells has a first width, the switch transistors in a second of the plurality of capacitance-switch cells has a second width, and the first width is different from the second width, and wherein the resistance circuit in the first of the plurality of capacitance-switch cells is configured to set a switching time of the first of the plurality of capacitance-switch cells to substantially match a switching time of the second of the plurality of capacitance-switch cells, the resistance of the resistance circuit for first of the plurality of capacitance-switch cells being different from the resistance of the resistance circuit for the second of the plurality of capacitance-switch cells.

2. The switchable capacitance circuit of claim 1, wherein the second terminal of each capacitance circuit of the plurality of capacitance-switch cells are coupled to a same node.

3. The switchable capacitance circuit of claim 1, wherein a value of the resistance of the resistance circuit is inversely proportional to a value of the capacitance of the capacitance circuit of the plurality of capacitance-switch cells.

4. The switchable capacitance circuit of claim 1, wherein a value of the capacitance of the capacitance circuit of a first of the plurality of capacitance-switch cells is different from a value of the capacitance of a second of the plurality of capacitance-switch cells.

5. The switchable capacitance circuit of claim 4, wherein a value of the resistance of the resistance circuit is inversely proportional to the value of the capacitance of the capacitance circuit in the plurality of capacitance-switch cells.

6. The switchable capacitance circuit of claim 1, wherein:
the resistance circuit comprises a resistor coupled between the first end and the second end of the resistance circuit; and
the capacitance circuit comprises a capacitor coupled between the first terminal and the second terminal of the capacitance circuit.

7. The switchable capacitance circuit of claim 6, wherein the capacitor comprises a plurality of series connected capacitors.

8. The switchable capacitance circuit of claim 6, wherein:
the resistor comprises a value that is substantially equal to a value of the resistance between the first end and the second end of the resistance circuit; and
the capacitor comprises a value that is substantially equal to a value of the capacitance between the first terminal and the second terminal of the capacitance circuit.

9. The switchable capacitance circuit of claim 1, wherein values of the capacitance of the capacitance circuit of the plurality of capacitance-switch cells are binary weighted.

10. The switchable capacitance circuit of claim 1, further comprising a control circuit having a plurality of outputs coupled to the corresponding control nodes of the plurality of capacitance-switch cells.

11. The switchable capacitance circuit of claim 1, wherein a second terminal of the semiconductor switching circuit of each of the plurality of capacitance-switch cells is coupled to ground.

12. The switchable capacitance circuit of claim 1, wherein the first width of the switch transistors in the first of the plurality of capacitance-switch cells is proportional to the second width of the switch transistors in the second of the plurality of capacitance-switch cells.

13. A method of operating a switchable capacitance circuit, the method comprising:

increasing a load capacitance of the switchable capacitance circuit comprising switching-on at least one of a plurality of capacitance-switch cells, wherein
each of the plurality of capacitance-switch cells comprises
a capacitance circuit having a capacitance between a first terminal and a second terminal of the capacitance circuit, and
a semiconductor switching circuit comprising
a first terminal coupled to the first terminal of the capacitance circuit,
a plurality of series connected radio-frequency (RF) switch cells comprising a load path and a common node, wherein each of the plurality of series connected RF switch cells comprises a switch transistor and a gate resistor having a first end coupled to a gate of the switch transistor and a second end coupled to the common node, and
a resistance circuit having a first end coupled to the common node and a second end coupled to a control node, wherein the resistance circuit comprises a resistance between the first end and the second end,
wherein the gate resistor in each of the plurality of RF switch cells has a same resistance value,
wherein the switch transistors in a first of the plurality of capacitance-switch cells has a first width, the switch transistors in a second of the plurality of capacitance-switch cells has a second width, and the first width is different from the second width, and
wherein the resistance circuit in the first of the plurality of capacitance-switch cells is configured to set a switching time of a first of the plurality of capacitance-switch cells to substantially match a switching time of a second of the plurality of capacitance-switch cells, the resistance of the resistance circuit for first of the plurality of capacitance-switch cells being different from the resistance of the resistance circuit for the second of the plurality of capacitance-switch cells,
switching-on comprises activating the semiconductor switching circuit of the at least one of the plurality of capacitance-switch cells; and
decreasing the load capacitance of the switchable capacitance circuit comprising switching-off the at least of the plurality of capacitance-switch cells, wherein switching-off comprises deactivating the semiconductor switching circuit of the at least one of the plurality of capacitance-switch cells.

14. The method of claim 13, wherein activating the semiconductor switching circuit of the at least one of the plurality of capacitance-switch cells comprises activating the plurality of series connected RF switch cells of the at least one of the plurality of capacitance-switch cells via the control node.

15. The method of claim 13, wherein a value of the resistance of the resistance circuit is inversely proportional to a value of the capacitance of the capacitance circuit of the plurality of capacitance-switch cells.

16. The method of claim 13, further comprising applying a RF signal to the switchable capacitance circuit.

17. The method of claim 13, further comprising:
coupling the switchable capacitance circuit to an antenna; and tuning the antenna by increasing and decreasing the load capacitance of the switchable capacitance circuit.

18. The method of claim 13, further comprising:
receiving a command from a digital interface; and
decoding the command, wherein increasing and decreasing the load capacitance further comprising selectively activating the semiconductor switching circuit of the plurality of capacitance-switch cells according to the decoded command.

19. A tunable radio-frequency (RF) circuit comprising:
a semiconductor substrate; and
a plurality of capacitance-switch cells disposed on the semiconductor substrate, wherein each capacitance-switch cell comprises:
   a capacitor coupled between a first terminal and a second terminal, and
   a semiconductor switching circuit comprising
      a first terminal coupled to the first terminal of the capacitor,
      a plurality of series connected radio-frequency (RF) switch cells comprising a load path and a common node, wherein each of the plurality of series connected RF switch cells comprises a switch transistor and a gate resistor having a first end coupled to a gate of the switch transistor and a second end coupled to the common node, and
      a common resistor having a first end coupled to the common node and a second end coupled to a control node,
   wherein the gate resistor in each of the plurality of RF switch cells has a same resistance value,
   wherein the switch transistors in a first of the plurality of capacitance-switch cells has a first width, the switch transistors in a second of the plurality of capacitance-switch cells has a second width, and the first width is different than the second width, and
   wherein the common resistor in the first of the plurality of capacitance-switch cells is selected such that a switching time of a first of the plurality of capacitance-switch cells substantially matches a switching time of a second of the plurality of capacitance-switch cells, the resistance of the resistance circuit for first of the plurality of capacitance-switch cells being different from the resistance of the resistance circuit for the second of the plurality of capacitance-switch cells.

20. The tunable RF circuit of claim 19, wherein a capacitance of the capacitor is inversely proportional to a resistance of the common resistor.

21. The tunable RF circuit of claim 19, wherein values of the capacitors of the plurality of capacitance-switch cells are binary weighted.

22. The tunable RF circuit of claim 19, wherein the switch transistor comprises a MOSFET transistor.

23. The tunable RF circuit of claim 22, wherein a gate width of the MOSFET transistor is proportional to a capacitance of the capacitor.

24. The tunable RF circuit of claim 19, wherein the capacitor comprises a metal-insulator-metal (MIM) capacitor.

25. The tunable RF circuit of claim 19, further comprising a driver circuit coupled to the control nodes of the plurality of capacitance-switch cells.

26. The tunable RF circuit of claim 25, further comprising at least one of a charge pump and a voltage regulator coupled to the driver circuit.

* * * * *